United States Patent
Bartels et al.

(10) Patent No.: US 6,275,974 B1
(45) Date of Patent: Aug. 14, 2001

(54) EFFICIENT TRACING OF SHORTS IN VERY LARGE NETS IN HIERARCHICAL DESIGNS USING BREADTH-FIRST SEARCH WITH OPTIMAL PRUNING

(75) Inventors: Ronald Allen Bartels, Bloomingburg; Ulrich Alfons Finkler, Monrose, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/238,421

(22) Filed: Jan. 28, 1999

Related U.S. Application Data

(60) Provisional application No. 60/114,475, filed on Dec. 30, 1998.

(51) Int. Cl.[7] .................................................. G06F 17/50
(52) U.S. Cl. ....................................................... 716/13
(58) Field of Search ...................................... 716/5, 12, 13

(56) References Cited

U.S. PATENT DOCUMENTS

| | | | |
|---|---|---|---|
| 5,481,473 | * | 1/1996 | Kim et al. .................................. 716/5 |
| 5,519,628 | * | 5/1996 | Russell et al. ........................... 716/10 |
| 5,880,969 | * | 3/1999 | Hama et al. ............................. 716/12 |
| 6,014,507 | * | 1/2000 | Fujii ........................................ 716/12 |

\* cited by examiner

Primary Examiner—Trong Phan
(74) Attorney, Agent, or Firm—McGuireWoods, LLP; Paul J. Otterstedt

(57) ABSTRACT

Tracing a short as a shortest path of explicit VLSI design component instances between two VLSI design component instances with different net names in a hierarchical design is a non-hierarchical problem. The method described in this document computes a shortest path of VLSI design leaf component instances containing at least one of the leaf design components causing the sort. To avoid exceeding available storage, the non-hierarchical instance information maintained during the process is pruned optimally. To achieve feasible performance, two methods to find "good" starting points are provided, based on geometrical distribution or based on connectivity information from the net build (if available).

8 Claims, 3 Drawing Sheets

EFFICIENT TRACING OF SHORTS IN VERY LARGE NETS IN HIERARCHICAL DESIGNS USING BREADTH-FIRST SEARCH WITH OPTIMAL PRUNING

CROSS-REFERENCE TO RELATED APPLICATIONS

This application is a continuation-in-part of provisional patent application Ser. No. 60/114,475 filed Dec. 30, 1998. This application is also related in subject matter to concurrently filed application Ser. No. 09238,420, entitled "Efficient Tracing of Shorts in Very Large Nets in Hierarchical Designs," filed by U. Finkler and R. Bartels and assigned to a common assignee (IBM Docket Y09-98-448), the subject matter of which is incorporated herein by reference.

BACKGROUND OF THE INVENTION

1. Field of the Invention

The present invention generally relates to tracing of shorts in very large nets in Very Large Scale Integrated (VLSI) circuit designs and, more particularly, to efficiently finding one electrical path containing at least one of the VLSI design component instances causing the short using Breadth First Search (BFS) with optimal pruning.

2. Background Description

The problem of tracing shorts in a circuit design is to find an electrical path, consisting of a small number of VLSI design component instances, such that it contains at least one of the VLSI design component instances that cause the short. We refer to such a path in the following as a "shorting path". Shorts between large nets, e.g., between circuit ground (GND) and source voltage (VDD), occur frequently in designs. Although existing tools are able to detect the existence of a short in a hierarchical design, finding a shorting path in large designs is extremely time consuming. The automated tracing of shorts between very large nets by existing software tools typically fails due to extreme storage or computation time requirements.

The problem of finding a short electrical path between two VLSI design component instances with different net attributes can be mapped to finding a short path in a graph, in which the vertices correspond to VLSI design component instances and the edges correspond to direct electrical connectivity between the two adjacent vertices. Net attributes are names attached to at least one VLSI design component instance on a net, where a net is a set of VLSI design component instances which form a connected component with respect to a relation as, for example, intersection between geometric shapes of which the VLSI design components are composed. Geometric shapes are the most elementary type of VLSI design components, which usually form the leaf components in the VLSI design hierarchy. In the following, we will refer to leaf components as "leafs". For detailed definitions of hierarchy, VLSI design components, nets, etc., see U.S. Pat. Nos. 5,519,628 and 5,481,473 and the reference materials, *Introduction to Algorithms*, by T. H. Corment, C. E. Leiserson, R. L. Rivest (MIT Press), hereafter referred to as "Algorithms", and *The LEDA Platform for Combinatorial and Geometric Computing*, by K. Mehlhom, and S. Näher (Cambridge University Press), hereafter referred to as "Geometric Computing".

"Algorithms" shows that the single source shortest path problem can be solved with a Breadth First Search (BFS) in O(N) time in unweighted graphs. In a hierarchical design, the standard shortest path search in unweighted and undirected graphs, BFS, cannot be applied directly without flattening the design. Flattening the design before processing results in unprocessable amounts of data for large designs.

BFS requires at least two Boolean values (representable as two bits in a computer memory) per instance of a leaf (i.e., per vertex), which indicate whether or not the vertex was unprocessed, touched or visited. A vertex was is called visited if its outgoing edges were investigated during the BFS. It is called touched if it was found by investigating an outgoing edge of another vertex. In a shortest path search in a hierarchical design at least these Boolean variables must be stored for each instance of a leaf, i.e., flat, even when the design is not flattened before processing.

SUMMARY OF THE INVENTION

It is therefore an object of the invention to provide a method to trace shorts efficiently with respect to time and storage requirements in large hierarchical designs. Particularly, the invention does not require a special representation of the design, only a capability to find all VLSI design component instances intersecting one particular design component instance is necessary in addition to access to the list of all objects in the considered net.

According to the present invention, there is provided a method which efficiently traces shorts in very large nets using the technique of pruning. The input to the trace short process of the invention is a hierarchically represented connected component of a net which is known to contain a short; i.e., it contains at least two VLSI design component instances attributed with different net names. In the following, we use place holders "A" and "B" for their net names. A connected component of a net is a set of VLSI design components such that there is an electrical path between each pair of components in that set. Note that this does not require a direct contact between each pair. Note also, that only a subset of the components are attributed due to the hierarchical structure. The connected component of the net containing the short, which consists out of a set of VLSI component instances in conducting layers of the design, is mapped to a graph as described above.

A starting leaf instance is identified. Since the only available information is the set of leaf instances and the net attributes, a leaf instance with label "A" and additional "start object properties" is identified as the starting leaf. A flat BFS is performed, storing instance related information in an auxiliary data structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
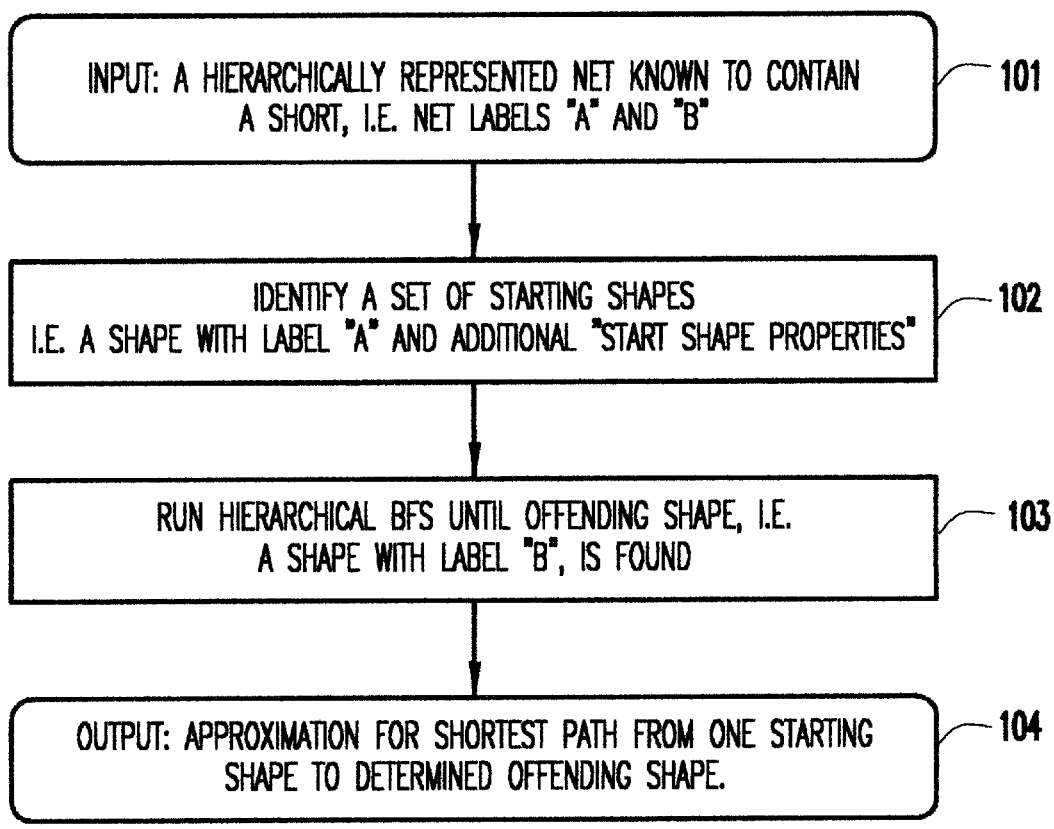
FIG. 1 is a flow diagram showing the process according to the invention.

Referring now to the drawings, and more particularly to FIG. 1, there is shown an overview of the trace short process.

The input 101 to the trace short process is a hierarchically represented net which is known to contain a short; i.e., it contains at least two VLSI design components attributed with net names, whose net names are different. We refer to these net names with the place holders "A" and "B" in the following. This net, which consists of a set of leaf instances in conducting layers of the design, is mapped to a graph as described above. For the description of the preferred embodiment, we assume that the VLSI leaf components are geometric shapes.

In function block 102, a set of starting leaf objects is identified. Since the only available information is the set of (hierarchically represented) leaf objects and the net attributes, the leaf objects with different attributes is a minimal set of shapes for which it is guaranteed that it contains the short. The shortest path out of all such paths is a minimum set of shapes for which it is guaranteed that it contains the short.

In this scenario, the length of each edge in the graph corresponding to the net may be "one", such that a Breadth First Search (see "Algonthms") can be used to determine shortest paths in function block 103. The output 104 is the shortest path from one starting shape to the determined offending shape.

Figure 2A:
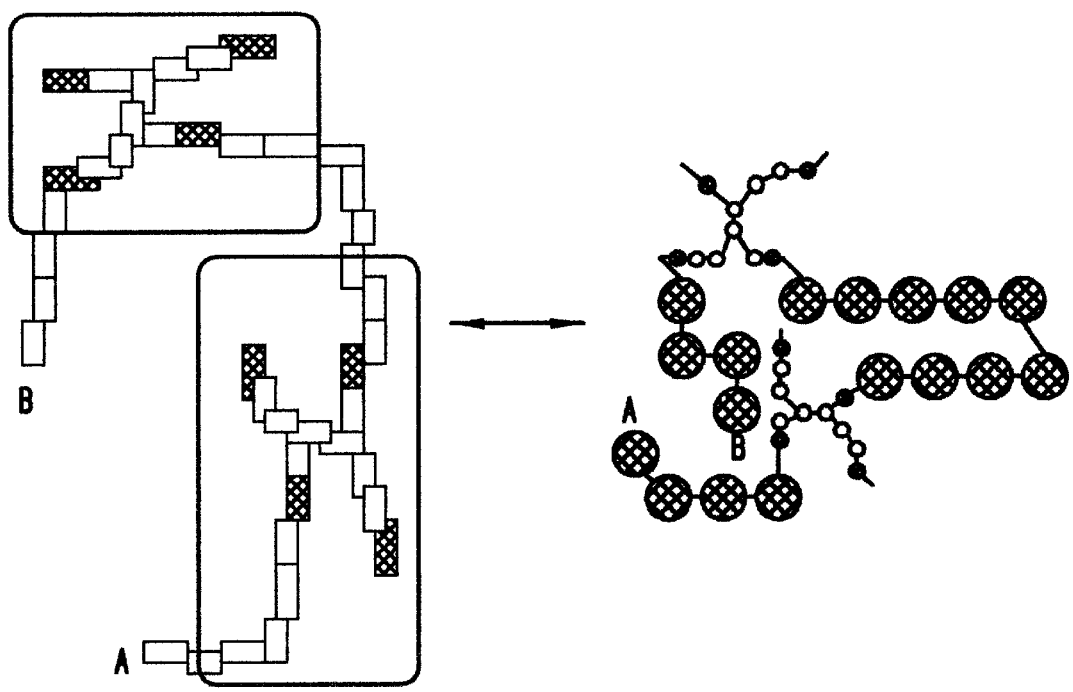
FIGS. 2A and 2B show an example of the flat representation of a net with two levels of hierarchy, along with their corresponding flat graphs of the leaf component instances, FIG. 2B showing the definition of the cell which is instantiated twice in FIG. 2A for a hierarchical cell design.
Figure 2B:
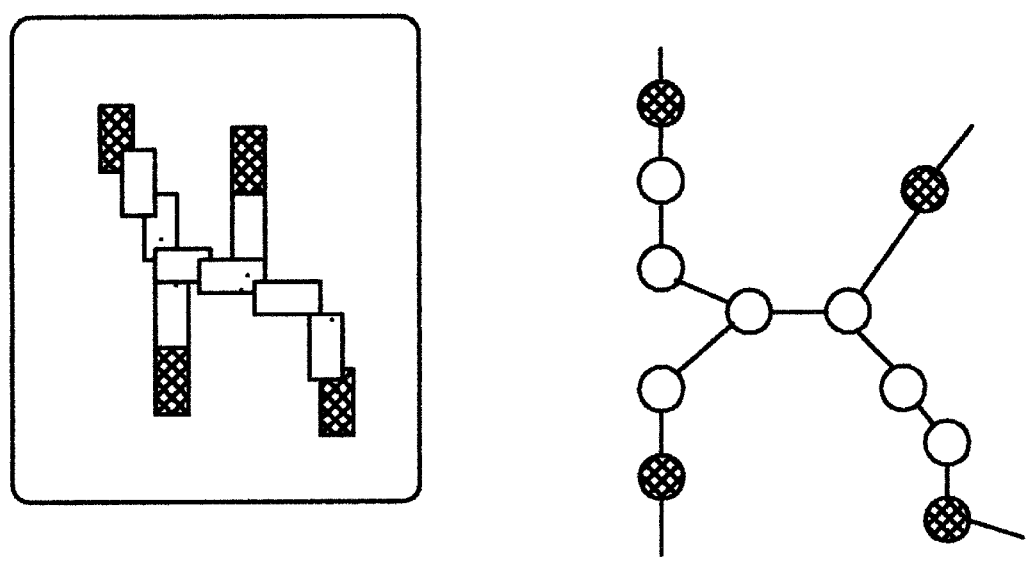

What distinguishes the problem of tracing shorts from the classic shortest path problem is the hierarchical structure of the design; i.e., components of the design (e.g., an adder or multiplexer), which are used multiple times are not copied; only a "transform" ( an information about what sub-circuit is placed at which coordinates) is maintained. FIGS. 2A and 2B illustrate examples of two cell instances with some native shapes and their corresponding flat graphs. FIG. 2A shows the flat view of the whole net with shapes labeled with A and B and the representing graph within this cell. FIG. 2B shows the cell which is instantiated twice and the equivalent graph. Applying the algorithms for the classic shortest path problem would require flattening the design at least partially, which is not practicable due to storage and performance requirements.

One major component of the trace short process is the capability to find shortest paths in a hierarchical design without storing more than the minimum of flat information necessary. This is achieved by optimally pruning the shortest path trees. The other component that determines efficiency is the set of starting leaf objects.

Optimal Pruning

Without loss of generality we restrict the following discussion to the single source shortest path problem; i.e., one starting leaf in the trace short process. Later it is generalized to the usage of multiple starting leafs.

An SShape is a binary datum which uniquely identifies an instance of a shape. An instance of a leaf corresponds to a path in the hierarchy (see U.S. Pat. Nos. 5,519,628 and 5,481,473). The BFS algorithm is combined with a binary search data structure (dictionary) with SShapes as keys. For each SShape, its predecessor in the shortest path tree is stored in the dictionary, together with the information whether it was visited or touched. Additional information stored with each SShape is described later in this section.

A leaf instance is contained in that dictionary if and only if it was visited during the breadth first search; i.e., its outgoing edges were investigated. But this is not sufficient. If a significant fraction of the design is traversed during the search, the storage requirement for the dictionary would be proportional to the flat size of the design, without additional precautions. To control the size of the dictionary, the fact is used that the graph of electrical connectivity in a flattened design is sparse and that we can define which paths in a single source shortest path tree are dead ends.

Def: A successor v of a node u is a node that was added to the BFS queue during the investigation of u. A predecessor is defined analogously.

Def.: A path in the BFS tree is defined through the relations predecessor and successor.

Def.: An active path in the breadth first search is a path, in which the node with the largest distance from the start node has at least one successor that is not visited; i.e., its outgoing edges are not investigated.

Lemma: Only nodes on an active path can be part of a shortest path from the start node of the BFS to a node with a target property; e.g., a specific net attribute, if the algorithm terminates after finding the first node with the target property.

Proof: If a path is inactive, it does not have any further successor, all nodes on this path are known. Since none of these nodes has the target attribute, it cannot be part of a resulting path from the starting node to a node with the target attribute.

Consequently, we can delete the nodes of any inactive path out of the dictionary and (virtually) out of the flat graph if we know that the nodes won't be touched. Note that the flat graph exists only virtually through the method to find all neighbors of an instance.

Def.: The f-degree of a node is the number of successors of this node.

Lemma.: A node can be deleted out of the dictionary and (virtually) out of the graph, if its f-degree is zero and its number of unvisited neighbors is zero.

Proof: A node is accessed in the dictionary through one of two reasons:

1. To find out if it was seen before when it is found at the end of an outgoing edge of a visited node.
2. To find its predecessor to compute the solution.

If the f-degree of a node is zero, it does not have a successor, and thus query (2) can not be issued. If none of its neighbors is unvisited, query (1) can not be issued anymore for this node. Note that the deletion of a node reduces the f-degree of its predecessor by one!

The Algorithm

With the definitions above, we can summarize the algorithm for the BFS with pruning on the graph corresponding to the design.

Perform a BFS, in which the insertion of a node into a dictionary is the witness of the fact that it was touched. Maintain the predecessor of the node, its f-degree, the state whether it is visited or not and the number of unvisited neighbors for each node in the dictionary. Each time a node has an f-degree and a number of unvisited neighbors of zero, it is deleted from the dictionary. If a node with the target attribute is touched, the path is reconstructed by looking up the predecessors in the dictionary.

After visiting a node, we check if itself or one of its neighbors becomes the end of an inactive path. In this case, the nodes on the inactive path are deleted as described above. Note that deleting a node from the dictionary might cause further deletions.

For a graph with N nodes (i.e., a design with N shape instances) the algorithm takes at most $O(N \log(N))$ time. The pruning allowed the BFS to traverse the whole design in cases in which it ran out of memory after a relatively small number of generations with a heuristic pruning.

Starting Shapes

In case of a short, we have a connected component of a net which contains shapes with two different attributes A and B. If we choose to define the net as net A, then shapes with attribute B are called offending shapes.

The performance of the algorithm described above depends strongly on the set of starting shapes, or more precisely, on the distance of the starting shape from the short and the minimum distance of an offending shape from the short. The number of generations in the BFS is the sum of these two distances. If this distance is in the order of magnitude of the diameter of the graph representing the flat design, the BFS will traverse a significant fraction of the flat design.

There are two possible ways to determine starting shapes:
1) The optimal way to find a start shape is during the computation of the electrical connectivity in the hierarchy. If the attributes are tracked during the computation of the electrical connectivity (netbuild), the shape instance next to the intrusion that merges two subnets with different attributes is likely to be close to the actual short. From this shape instance a BFS with optimal pruning is started looking for any shape instance with one of the two attributes found in the net. Without loss of generality this attribute is assumed to be "A". The resulting shape instance is used as a starting shape to a second BFS with optimal pruning finding a shortest path from this shape instance attributed with "A" to an offending shape instance attributed with "B".
2) In practice, it is often desirable to perform the netbuild without tracking the attributes (to reduce the storage requirements) and to build the nets out of intrusions found in an order optimized for efficiency rather than in a seed based fashion. In this case, the netbuild cannot provide a good starting shape. Instead of using an arbitrary shape with a starting attribute, a set of starting shapes is used. These shapes are approximately uniformly distributed over the area of the design covered by the net. Since these shapes are attributed only one BFS is performed.

To extend the algorithm described above to work with multiple starting shapes, a virtual node is added to the graph (which is the single source for the single source shortest path tree) whose neighbors form the desired set of starting shapes. To determine a spatially distributed set of starting shapes a rectangular grid is thrown over the area covered by the (flat) design and out of each sector of the grid containing shapes of the investigated net with the desired start attribute one shape is chosen, as close to the middle of the rectangular sector as possible. If a sufficiently large amount of shapes is attributed the short will be within one sector with one of the starting shapes. If a uniform distribution of the shapes and quadratic sectors are assumed, the average distance of the short to the next starting shape will be smaller than half the width of a sector and although the width of the shortest path tree increases with the number of starting shapes, the number of generations until a path is found decreases. This heuristic has proven to speed up the shortest path search significantly in experiments.

Figure 3:
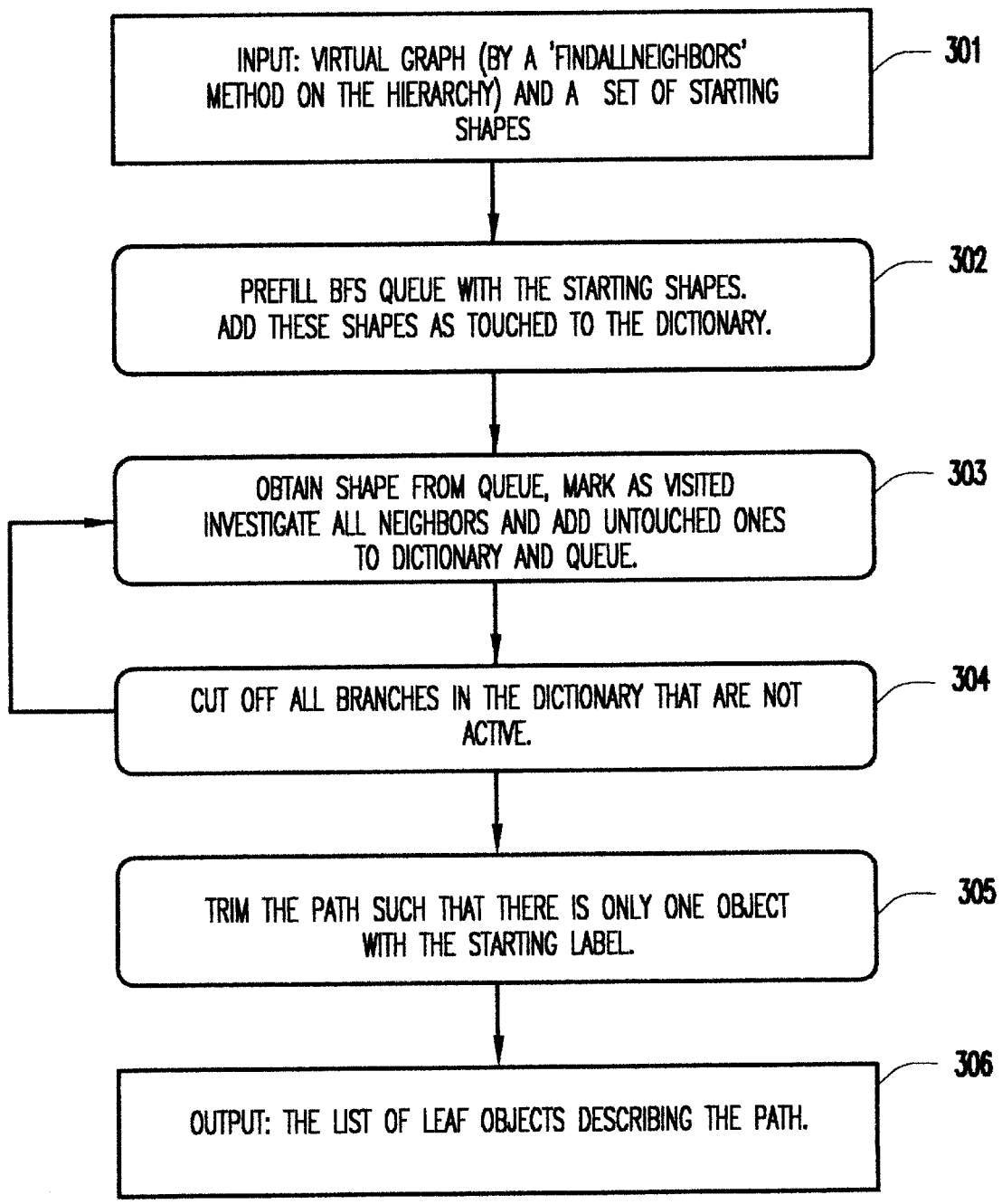
FIG. 3 is a flow diagram showing the logic of a specific implementation of the invention.

FIG. 3 illustrates an implementation of the BFS with pruning according to the invention. The flat graph (see FIGS. 2A and 2B) exists only virtually. Vertices for which we have to store information in the flat view are maintained in the dictionary. The key to the dictionary is a unique descriptor of the instance; i.e., the path in the hierarchy.

The input 301 is the virtual graph and a set of starting shapes. The BFS-queue is prefilled with the starting shapes in function block 302. These shapes as touched are added to the dictionary. A shape is obtained from the queue in function block 303 and marked as visited. All neighbors of the shape obtained from the queue are investigated, and untouched shapes are added to the dictionary and the queue. In process block 304, all branches in the dictionary that are not active are cut off. The processing steps 303 and 304 continue until all shapes in the dictionary have been processed or an offending shape has been found. Then, in function block 305, the path is trimmed such that there is only one object with the starting label. The output 306 is a list of the leaf objects describing the path.

The implementation using one start shape determined during the net build has shown in very large problem instances excellent performance. The search tree is significantly narrower with one starting shape than with 200 to 400 starting shapes although the number of generations necessary is in the same order of magnitude as with the distributed set of start shapes.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for efficiently tracing shorts in very large nets in hierarchical Very Large Scale Integrated (VLSI) circuit designs comprising the steps of:

inputting a net which is known to contain a short, said net consisting of a set of VLSI leaf components in conducting layers of the design;

mapping said net to a graph;

identifying a set of starting VLSI design leaf component instances wherein VLSI design leaf component instances on a shortest path between two VLSI design leaf component instances with different net attributes form a minimal set of VLSI design leaf component instances for which it is guaranteed that it contains the short; and using a Breadth First Search to determine shortest paths.

2. The method according to claim 1, wherein the mapping step virtually maps the connected component to the graph such that the flat graph is never constructed explicitly.

3. The method according to claim 2, further comprising the step of pruning at the earliest possible time all inactive paths to minimize an amount of flat information that is maintained.

4. A method of tracing a short as a shortest path of explicit Very Large Scale Integrated (VLSI) circuit component instances between two VLSI design component instances with different net names in a hierarchical design comprising the steps of:

inputting a virtual graph of the hierarchical design and a set of starting shapes corresponding to components in the design;

computing a shortest path of VLSI design leaf component instances containing at least one of the leaf design components causing a short; and pruning non-hierarchical instance information to avoid exceeding available storage.

5. The method according to claim 4, wherein a connected component of a net contains VLSI design leaf component instances with two different attributes A and B, VLSI design leaf component instances with attribute B being called offending VLSI design leaf component instances, and further comprising the step of determining starting VLSI design leaf component instances comprising the steps of:

tracking attributes during computation of electrical connectivity in the hierarchical net; and identifying a design leaf component instance next to an intrusion that merges two subnets with different attributes.

6. The method according to claim 4, wherein the step of computing a shortest path of VLSI design leaf component instances comprises the steps of:

starting a first Breadth First Search (BFS) with pruning to look for any shape instance with attribute A found in the net; and starting a second BFS with pruning to find a shortest path from a shape found by the first BFS to an offending shape instance with attribute B.

7. The method according to claim 4, wherein the step of computing a shortest path of VLSI design leaf component instances comprises the step of starting a Breadth First Search (BFS) of the selected starting VLSI design leaf component instances to find one offending shape.

8. The method according to claim 4, further comprising the step of determining VLSI design leaf component instances by selecting a set of geometrically evenly distributed starting VLSI design leaf component instances in the net.

* * * * *